United States Patent
Liu

(10) Patent No.: US 9,118,306 B2
(45) Date of Patent: Aug. 25, 2015

(54) OVERSAMPLING METHOD FOR DATA SIGNAL AND OVERSAMPLING APPARATUS THEREOF

(71) Applicant: REALTEK SEMICONDUCTOR CORP., HsinChu (TW)

(72) Inventor: Ye Liu, Suzhou (CN)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/046,199

(22) Filed: Oct. 4, 2013

(65) Prior Publication Data
US 2014/0375365 A1 Dec. 25, 2014

(30) Foreign Application Priority Data
Jun. 19, 2013 (CN) .......................... 2013 1 0245379

(51) Int. Cl.
*H04L 7/00* (2006.01)
*H03K 5/01* (2006.01)
(52) U.S. Cl.
CPC ........................................ *H03K 5/01* (2013.01)
(58) Field of Classification Search
CPC ....................................................... H03K 5/01

USPC .......................................................... 375/355
See application file for complete search history.

(56) References Cited

U.S. PATENT DOCUMENTS 7,724,161 B1 * 5/2010 Cyrusian .......................... 341/53
2014/0205028 A1 * 7/2014 Bogdan .......................... 375/260

* cited by examiner

*Primary Examiner* — Tanmay Shah
(74) *Attorney, Agent, or Firm* — Muncy, Geissler, Olds & Lowe, P.C.

(57) ABSTRACT

An oversampling method for data signal includes oversampling data strobe signal and data signal according to sampling phases to generate first and second sampling results, performing edge detection on the first and second sampling results to obtain first and second edge positions where edges are detected, calculating and storing first offset according to the first edge position and the corresponding second edge position when the second edge position are obtained, using first offset obtain in a previous sampling cycle as the first offset in a current sampling cycle when the second edge position aren't obtained, calculating first sampling point according to the first edge position; calculating second sampling point according to the first sampling point and the corresponding first offset, and selecting and outputting the corresponding second sampling results according to the second sampling point.

19 Claims, 8 Drawing Sheets

OVERSAMPLING METHOD FOR DATA SIGNAL AND OVERSAMPLING APPARATUS THEREOF

CROSS-REFERENCES TO RELATED APPLICATIONS

This non-provisional application claims priority under 35 U.S.C. §119(a) on Patent Application No. 201310245379.8 filed in China on Jun. 19, 2013, the entire contents of which are hereby incorporated by reference.

BACKGROUND

1. Technical Field

The present invention relates to control technologies of a controller in a memory module, and more particularly, to an oversampling method for data signal and oversampling apparatus thereof.

2. Related Art

Please refer to FIG. 1, in which a memory module 10 includes a dynamic random access memory (DRAM) 12 and a controller 14. The controller 14 uses a data signal DQ and a data strobe signal DQS to access the DRAM 12. Generally, upon delivery, the memory module 10 is designed to provide a time delay, to delay the data signal DQ and/or data strobe signal DQS, thereby achieving the optimal performance of control over the DRAM 12. A delay chain 142 is generally used in the controller 14 to provide the required time delay.

However, due to influences of changes of external factors such as temperature, the phase difference between the data signal DQ and the data strobe signal DQS may not be maintained constantly. The time delay of the delay chain may also vary with changes of external factors such as temperature and voltage. These factors will cause actual sampling points to deviate from the optimal sampling point of the data signal DQ, thereby leading to an error in data sampling.

In actual applications, a sampling circuit 140 in the controller 14 may first enter a calibration mode. In the calibration mode, the sampling circuit 140 may adjust the time delay of the delay chain through known data sent from the DRAM 12 to the controller 14, to accurately receive the data sent from the DRAM 12, thereby obtaining an optimal position of sampling the data signal DQ with the data strobe signal DQS. Consequently, although the problem of deviation of the actual sampling points can be solved by frequently entering the calibration mode, too many calibrations may affect normal exchange of data, thereby reducing the efficiency of the memory module 10.

Furthermore, as the operating frequency of the memory module 10 is increasingly raised, a relatively effective sampling window is narrowed down, so that the problem brought about by deviation of the sampling points is more severe and becomes a key factor that holds back the raising of the operating frequency of the memory module 10.

SUMMARY

In an embodiment, an oversampling method for data signal includes: oversampling a data strobe signal and a data signal according to a plurality of sampling phases to respectively generate a plurality of first sampling results and a plurality of second sampling results; performing edge detection on the first sampling results to obtain at least one first edge position where edges are detected among the first sampling results; performing edge detection on the second sampling results to find out second edge position where edges are detected among the second sampling results; when the second edge positions are obtained, calculating first offsets according to the first edge position and the second edge position corresponding to the same sampling phase; when the second edge positions are not obtained, using at least one first offset obtained in a previous sampling cycle as the first offset in a current sampling cycle; calculating at least one first sampling point according to the first edge position; calculating at least one second sampling point according to the first sampling point and the corresponding first offset; and selecting and outputting the corresponding second sampling result according to the second sampling point.

In an embodiment, an oversampling apparatus includes a clock generator, an oversampling circuit, a first edge detector, a second edge detector, a phase detector, a subtraction unit, an addition unit and an output unit.

The oversampling circuit oversamples a data strobe signal and a data signal according to a multiphase clock generated by the clock generator, to respectively generate a plurality of first sampling results and a plurality of second sampling results. The first edge detector performs edge detection on the first sampling results, to obtain first edge positions where edges are detected among the first sampling results. The second edge detector performs edge detection on the second sampling results, to find out second edge positions where edges are detected among the second sampling results. The phase detector calculates at least one first sampling point according to the first edge positions. The subtraction unit calculates first offsets according to the first edge positions and the second edge positions. The addition unit calculates second sampling points according to the first sampling points and the first offsets corresponding thereto. The output unit selects and outputs the corresponding second sampling results according to the second sampling points.

In sum, the oversampling method for data signal and the oversampling apparatus thereof according to the present invention are applied to a memory module, to obtain oversampled data of a data signal. In the oversampling method for data signal and the oversampling apparatus thereof according to the present invention, data is extracted by oversampling a data signal and a data strobe signal simultaneously, which avoids using a delay chain and can automatically track a phase difference change between the data signal and the data strobe signal, so as to improve stability of a controller of the memory module on data reading, thereby meeting the demand of increasingly raising the operating frequency of the memory module.

BRIEF DESCRIPTION OF THE DRAWINGS

The disclosure will become more fully understood from the detailed description given herein below for illustration only and thus not limitative of the disclosure, wherein.

DETAILED DESCRIPTION

Figure 1:
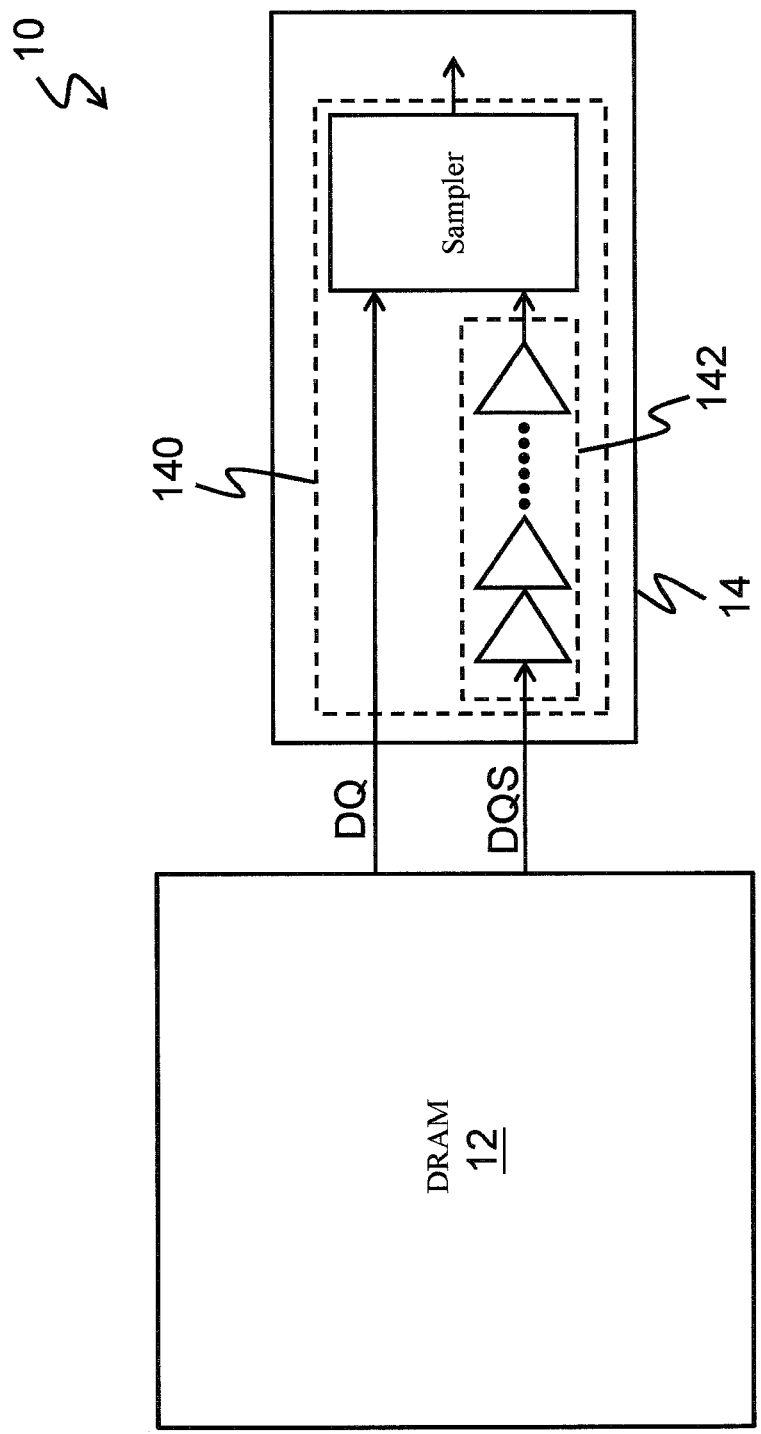
FIG. 1 is a schematic diagram of a memory module in the prior art.
Figure 2:
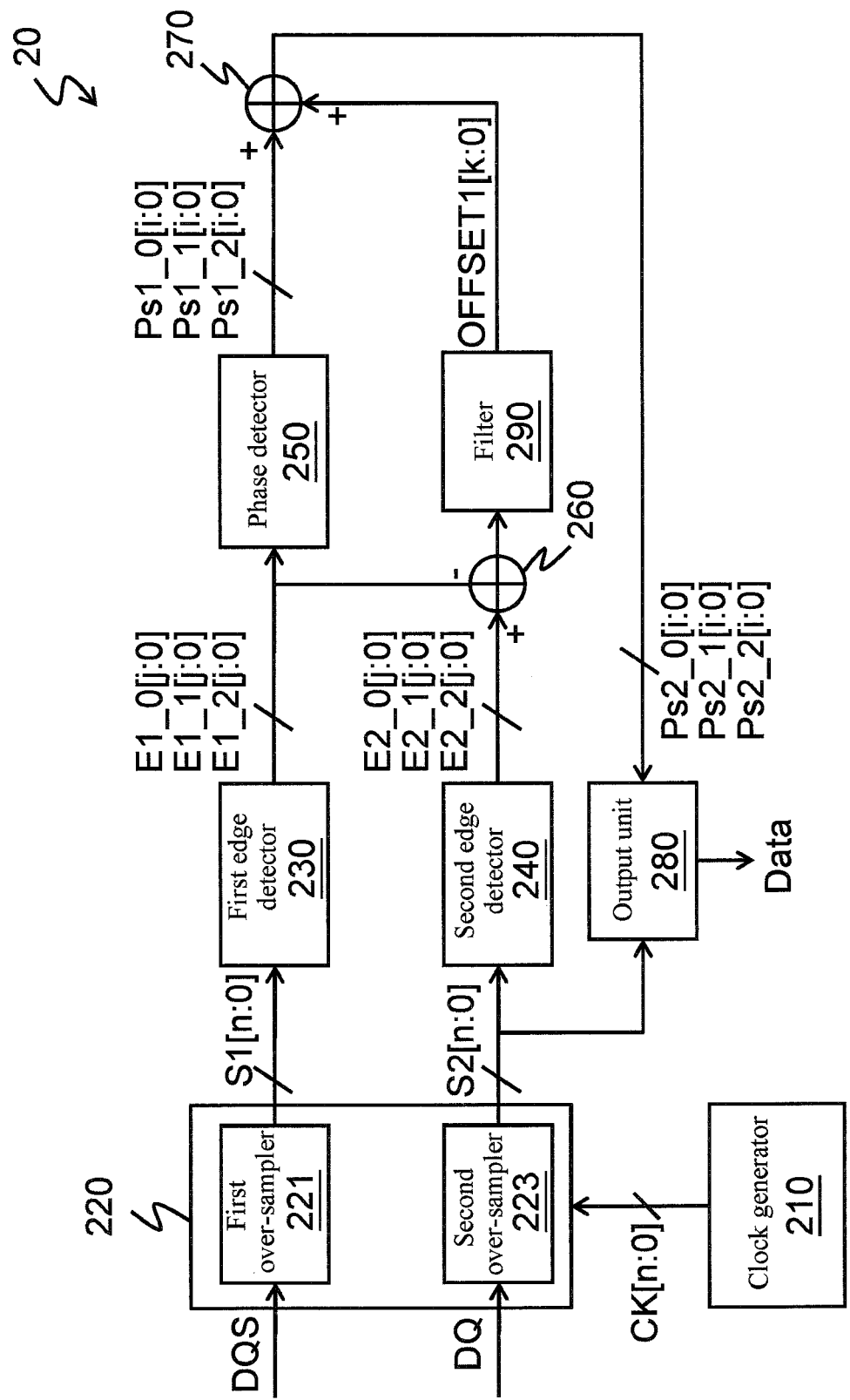
FIG. 2 is a schematic diagram of an oversampling apparatus according to an embodiment of the present invention.

Please refer to FIG. 2, in which in an embodiment, an oversampling apparatus 20 includes a clock generator 210, an oversampling circuit 220, a first edge detector 230, a second edge detector 240, a phase detector 250, a subtraction unit 260, an addition unit 270 and an output unit 280.

An output end of the clock generator 210 is connected electrically to a control end of the oversampling circuit 220. The oversampling circuit 220 may include a first over-sampler 221 and a second over-sampler 223, and the clock generator 210 is connected electrically to a control end of the first over-sampler 221 and a control end of the second over-sampler 223 respectively. An output end of the first over-sampler 221 is connected electrically to an input end of the first edge detector 230. An output end of the second over-sampler 223 is connected electrically to an input end of the second edge detector 240 and an input end of the output unit 280. An output end of the first edge detector 230 is connected electrically to an input end of the phase detector 250 and an input end of the subtraction unit 260. An output end of the second edge detector 240 is connected electrically to another input end of the subtraction unit 260. An output end of the phase detector 250 is connected electrically to an input end of the addition unit 270, and an output end of the subtraction unit 260 is connected electrically to another input end of the addition unit 270. An output end of the addition unit 270 is connected electrically to a control end of the output unit 280.

The clock generator 210 generates a multiphase clock CK[n:0], and outputs the multiphase clock CK[n:0] to the first over-sampler 221 and the second over-sampler 223. The first over-sampler 221 receives a data strobe signal DQS, and oversamples the data strobe signal DQS according to the multiphase clock CK[n:0] to generate a plurality of first sampling results S1[n:0]. The second over-sampler 223 receives a data signal DQ, and oversamples the data signal DQ according to the multiphase clock CK[n:0] to generate a plurality of second sampling results S2[n:0]. In other words, with reference to FIGS. 3A, 3B and 3C, the multiphase clock CK[n:0] has n sampling phases p0 to pn, and the first over-sampler 221 and the second over-sampler 223 take the n sampling phases p0 to pn as sampling points to oversample the data strobe signal DQS and the data signal DQ respectively, where n is a positive integer.

In some embodiments, the first over-sampler 221 and the second over-sampler 223 adopt a half rate sampling technology, that is, the frequency of the multiphase clock CK[n:0] is half of a data rate. For example, please refer to FIGS. 3A, 3B and 3C, in which by taking n=9 as an example, a multiphase clock CK[9:0] has 10 sampling phases p0 to p9. At this time, the first over-sampler 221 uses the sampling phases p0 to p9 to oversample the data strobe signal DQS five times, to obtain a first sampling result S1[9:0]. The second over-sampler 223 uses the sampling phases p0 to p9 to oversample the data signal DQ five times, to obtain a second sampling result S2[9:0].

The first edge detector 230 receives the first sampling results S1[n:0], and performs edge detection on the first sampling results S1[n:0], to obtain at least one first edge position. E1_0[j:0], E1_1[j:0] and E1_2[j:0] where edges are detected among the first sampling results S1[n:0].

The second edge detector 240 receives the second sampling results S2[n:0], and performs edge detection on the second sampling results S2[n:0], to find out second edge position E2_0[j:0], E2_1[j:0] and E2_2[j:0] where edges are detected among the second sampling results S2[n:0] (the edge number may vary between 0 to 3), and j is a positive integer.

After the first edge positions E1_0[j:0], E1_1[j:0] and E1_2[j:0] are obtained, the phase detector 250 calculates at least one first sampling point Ps1_0[i:0], Ps1_1[i:0] and Ps1_2[i:0] according to the first edge positions E1_0[j:0], E1_1[j:0] and E1_2[j:0], where i is a positive integer.

When the second edge detector 240 finds out and obtains the second edge positions E2_0[j:0], E2_1[j:0] and E2_2[j:0], the subtraction unit 260 calculates a first offset OFFSET1[k:0] according to the first edge position E1_0[j:0]/E1_1[j:0]/E1_2[j:0] and the second edge position E2_0[j:0]/E2_1[j:0]/E2_2[j:0] corresponding to the same sampling phase, where k is a positive integer.

The addition unit 270 calculates a second sampling point Ps2_0[i:0]/Ps2_1[i:0]/Ps2_2[i:0] according to each first sampling point Ps1_0[i:0]/Ps1_1[i:0]/Ps1_2[i:0] and the corresponding first offset OFFSET1[k:0]. When the second edge detector 240 does not find/obtain the second edge positions E2_0[j:0], E2_1[j:0] and E2_2[j:0], the addition unit 270 uses the first offset OFFSET1[k:0] obtained in previously sampling cycle for calculation directly.

The output unit 280 selects at least one second sampling result according to each second sampling point Ps2_0[i:0]/Ps2_1[i:0]/Ps2_2[i:0] as a sampling signal Data, and outputs the sampling signal Data.

In some embodiments, a filter 290 may be coupled between the subtraction unit 260 and the addition unit 270. In some embodiments, the filter 290 may be a low-pass filter.

With this architecture, the following Formula 1 can be obtained.

Second sampling point=first sampling point+first offset  Formula 1

According to Formula 1, in the oversampling method for data signal and the oversampling apparatus thereof according to the present invention, the optimal sampling point (i.e., the second sampling point), of the data signal DQ is obtained through the optimal sampling point (i.e., the first sampling point), of the data strobe signal DQS.

When the first offset OFFSET1[k:0] changes slowly (i.e., corresponding to changes of external factors such as temperature), a gain of the filter 290 approximates 1. Therefore, the actual sampling point of the data signal DQ may be tracked to the optimal sampling point (i.e., the second sampling point), of the data signal DQ, and thus the optimal sampling point of the data signal DQ still can be used for sampling in the case that the external condition changes. When the first offset OFFSET1[k:0] changes quickly (i.e., corresponding to changes of factors such as cross talk, simultaneous switching noise (SSN) and/or inter symbol interference (ISI)), the filter 290 may filter high-frequency noises, and maintain stable parts in the first offset OFFSET1[k:0], so as to provide a capability of resisting high-frequency noise interference on the basis of ensuring traceability.

Figure 3A:
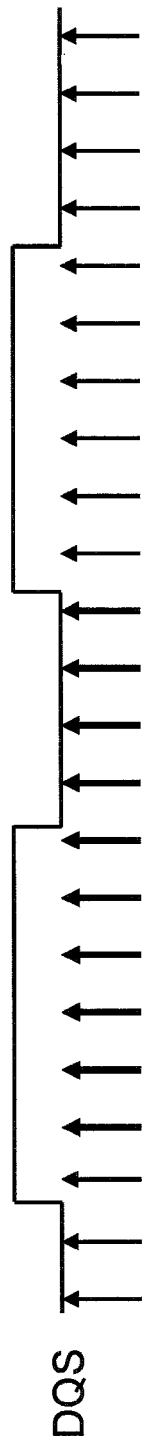
FIG. 3A is a schematic diagram of a first embodiment of oversampling a data strobe signal in the oversampling apparatus of FIG. 2.
Figure 3B:
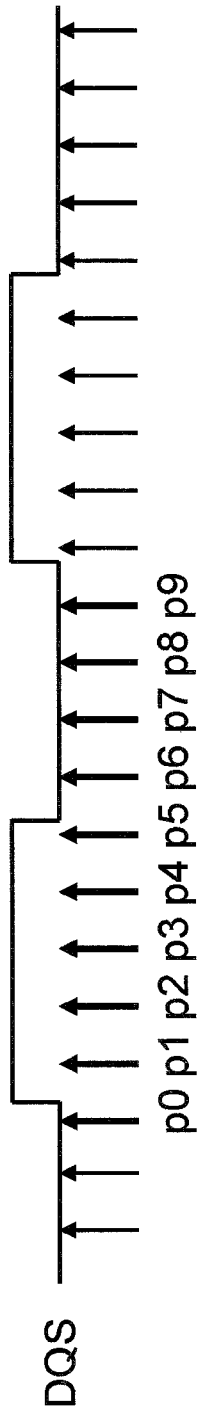
FIG. 3B is a schematic diagram of a second embodiment of oversampling the data strobe signal in the oversampling apparatus of FIG. 2.
Figure 3C:
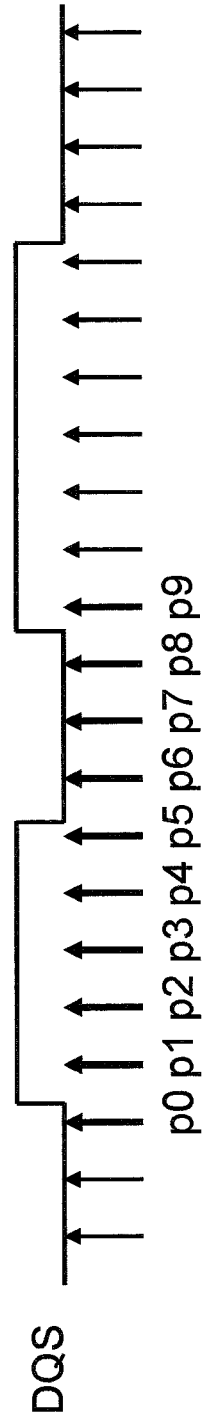
FIG. 3C is a schematic diagram of a third embodiment of oversampling the data strobe signal in the oversampling apparatus of FIG. 2.

In some embodiments, by taking n=9 as an example, the following description is given based on the first edge detector 230, and the operation of the second edge detector 240 is substantially identical with that of the first edge detector 230, which is not repeated herein. Please refer to FIGS. 3A, 3B and 3C, in which the first sampling result S1[9:0] obtained by each oversampling has 10 bits, to indicate the oversampling result of the data strobe signal DQS of two consecutive unit intervals (UIs). The 10-bit first sampling result S1[9:0] may have 0 edge, 1 edge (as shown in FIG. 3A), 2 edges (as shown in FIG. 3B), or 3 edges (as shown in FIG. 3C). The first edge detector 230 needs to obtain the position where each edge is detected among the 10-bit first sampling result S1[9:0] and the edge type thereof (e.g., rising edge or falling edge).

Figure 4:
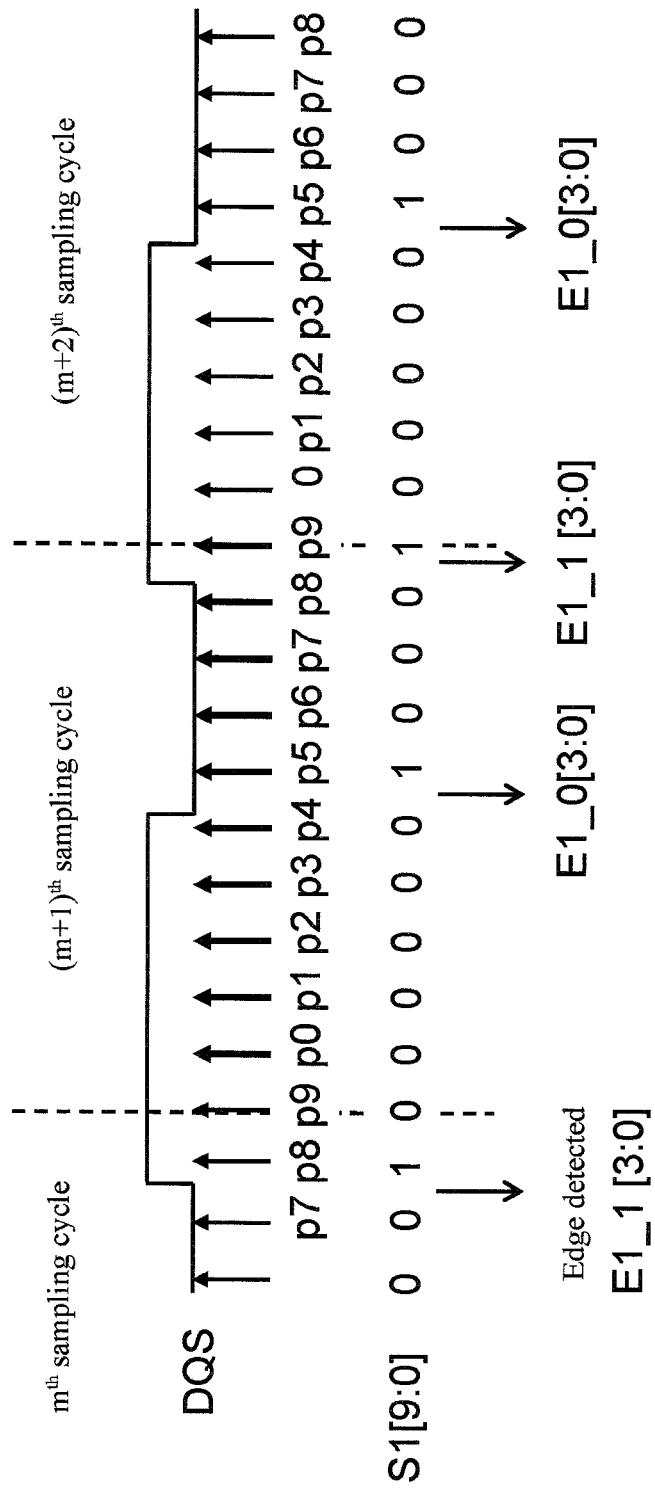
FIG. 4 is a schematic diagram of a relationship between the data strobe signal, first sampling results and first edge positions in the oversampling apparatus of FIG. 2.

In some embodiments, the first edge detector 230 uses a corresponding sampling number when an edge is detected to indicate the position where the edge is detected. In other words, the $(j+1)^{th}$ power of 2 is greater than or equal to the bit number (n+1) of the first sampling result S1[n:0]. In some embodiments, the edges may be numbered according to the sequence when they are detected, for example, the first detected edge is corresponding to the first edge position E1_0[j:0] where the edge is detected, the second detected edge is corresponding to the first edge position E1_1[j:0] where the edge is detected, and the third detected edge is corresponding to the first edge position E1_2[j:0] where the edge is detected. For example, please refer to FIG. 4, in which in the $(m+1)^{th}$ sampling cycle, the sampling number corresponding to the first edge that is detected by the first edge detector 230 is 5 (that is, the sampling phase p5), and thus the first edge position E1_0[3:0] correspondingly generated by the first edge detector 230 is "0101". Likewise, the sampling number corresponding to the second edge that is detected by the first edge detector 230 is 9 (that is, the sampling phase p9), and thus the first edge position E1_1[3:0] correspondingly generated by the first edge detector 230 is "1001", where m is a positive integer.

In some embodiments, the first edge detector 230 divides the 10-bit first sampling result S1[9:0] into two groups. The 5-bit first sampling result S1[4:0] is set as Group 1, and the other 5-bit first sampling result S1[9:5] is set as Group 2. As the frequency of the data strobe signal DQS is half of the input data rate and is identical with that of the multiphase clock CK[n:0] for oversampling, not more than 2 edges are detected in every 5 first sampling results (i.e., the 5-bit first sampling result S1[4:0] or first sampling result S1[9:5]), and the edge types of any two adjacent edges may be opposite (i.e., one is a rising edge while the other is a falling edge). Based on the principle that the edge types are distributed in an interlaced manner, the first edge detector 230 acquires a corresponding oversampling number when an edge is detected and the edge type thereof by analyzing whether adjacent bits in each group of the first sampling results S1[4:0]/S1[9:5] are the same.

In some embodiments, the first edge detector 230 determines the edge type of the first detected edge in the first sampling results S1[n:0] obtained in this oversampling process according to the edge type of the last detected edge in the first sampling results S1[n:0] obtained in the previous oversampling process.

For instance, it is assumed that in the $m^{th}$ sampling cycle, the last detected edge in the first sampling result S1[9:0] generated by the first over-sampler 221 is a rising edge. At this time, in the $(m+1)^{th}$ sampling cycle, the first edge detector 230 determines the first detected edge in the first sampling result S1[4:0] of Group 1 to be a falling edge. When no edge is obtained in the first sampling result S1[4:0] of Group 1, the first edge detector 230 determines the first detected edge in the first sampling result S1[9:5] of Group 2 to be a falling edge.

In the $(m+1)^{th}$ sampling cycle, the first edge detector 230, after obtaining the first edge in the first sampling result S1[9:0], can sequentially determine the edge types of the edges subsequently obtained based on the principle that the edge types are distributed in an interlaced manner. For example, please refer to FIG. 4, in which in the $m^{th}$ sampling cycle, the last edge obtained by the first edge detector 230 is a rising edge. In the $(m+1)^{th}$ sampling cycle, the first edge detector 230 obtains no edge in the first sampling result S1[4:0] of Group 1, and thus determines the first edge obtained in the first sampling result S1[9:5] of Group 2 to be a falling edge, that is, the first edge position E1_0[3:0] is labeled as a falling edge. Additionally, the first edge detector 230 determines the second edge obtained in the first sampling result S1[9:5] of Group 2 to be a rising edge, that is, the first edge position E1_1[3:0] is labeled as a rising edge.

In some embodiments, the phase detector 250 may calculate intermediate values of the first edge positions E1_0[j:0] and E1_1[j:0]/E1_1[j:0] and E1_2[j:0] of two adjacent edges to obtain first sampling points Ps1_0[i:0] and Ps1_1[i:0]. For example, please refer to FIG. 4, in which the first edge position E1_0[3:0] and its adjacent first edge position E1_1[3:0] correspond to the sampling phase p5 and the sampling phase p9, and the phase detector 250 may calculate an intermediate value between the first edge position E1_0[3:0] and the first edge position E1_1[3:0] to obtain that the first sampling point Ps1_0[i:0] is the sampling phase p7.

In some embodiments, in the $(m+1)^{th}$ sampling cycle, the phase detector 250 further calculates the last first edge position E1_1[3:0] in the $(m+1)^{th}$ sampling cycle and the $1^{st}$ first edge position E1_0[3:0] in the $(m+2)^{th}$ sampling cycle to obtain the last first sampling point Ps1_1[i:0].

Furthermore, in some embodiments, in the $(m+1)^{th}$ sampling cycle, the phase detector 250 calculates an intermediate value between the last first edge position in the $m^{th}$ sampling cycle and the $1^{st}$ first edge position E1_0[j:0] in the $(m+1)^{th}$ sampling cycle to obtain the $1^{st}$ first sampling point Ps1_0[i:0]. The phase detector 250 continues to calculate other first sampling points Ps1_1[i:0] and Ps1_2[i:0] with any two adjacent first edge positions in the $(m+1)^{th}$ sampling cycle.

In some embodiments, the phase detector 250 may use average values of offsets (DQS_OFFSET), from the optimal sampling positions (i.e., the first sampling points Ps1_0[i:0], Ps1_1[i:0] and Ps1_2[i:0]), obtained in the previous sampling cycle to edges as the basis of calculating the first sampling points in the current sampling cycle, which is as shown in Formula 2.

$$DQS\_OFFSET = (\text{first sampling points} - \text{first edge positions}) \times \text{filter gain} \quad \text{Formula 2}$$

As the data signal DQ and the data strobe signal DQS may have different duty cycle distortions (DCDs), the offsets (DQS_OFFSET), corresponding to the rising edge and the falling edge may be different. The phase detector 250 may respectively calculate the offsets (DQS_OFFSET), corresponding to the rising edge and the falling edge, and then corresponding to the edge types of the first edge positions E1_0[j:0], E1_1[j:0] and E1_2[j:0], calculate the first sampling points Ps1_0[i:0], Ps1_1[i:0] and Ps1_2[i:0] according to the first edge positions E1_0[j:0], E1_1[j:0] and E1_2[j:0] and the corresponding offsets (DQS_OFFSET).

Figure 5:
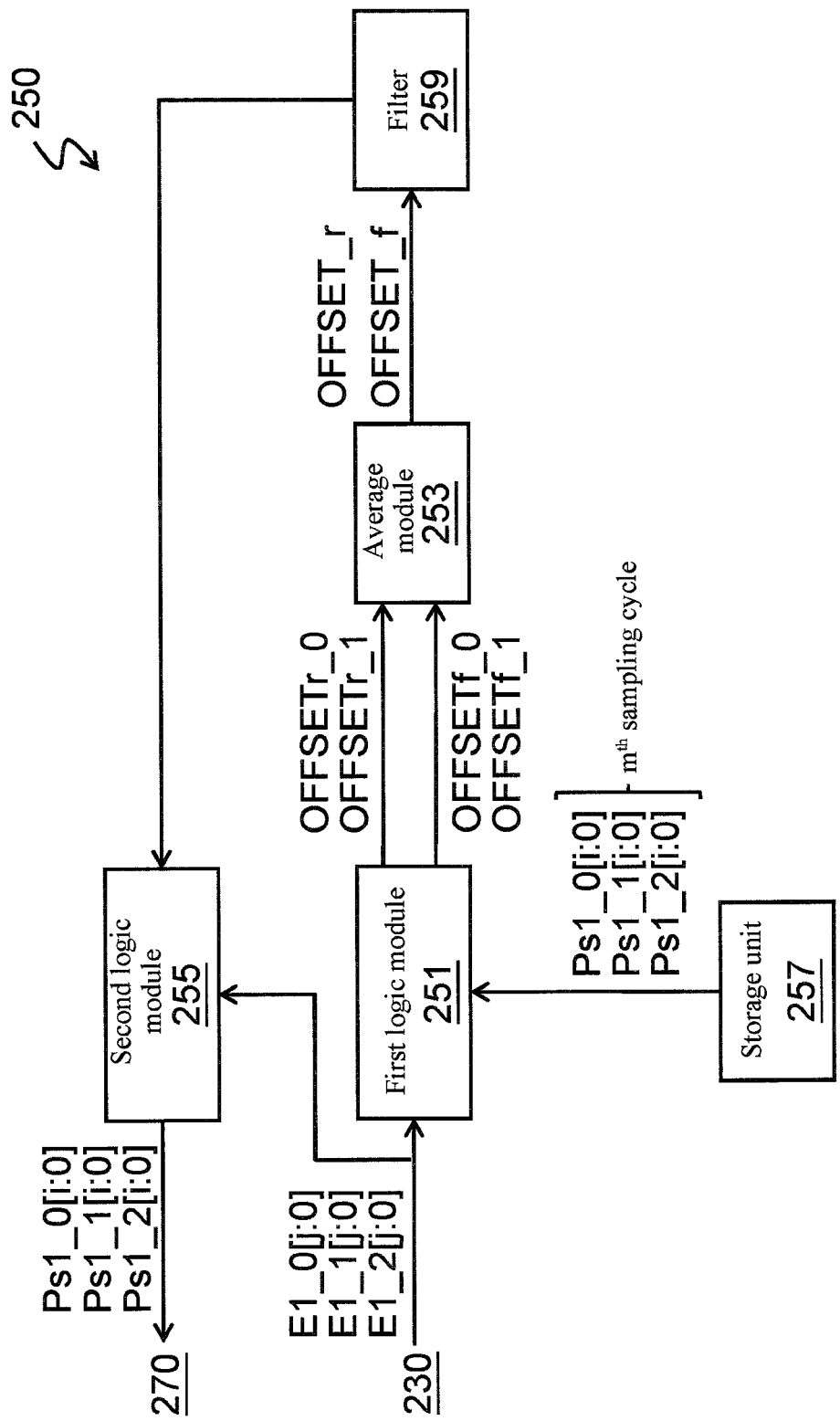
FIG. 5 is a schematic diagram of an embodiment of a phase detector in the oversampling apparatus of FIG. 2.

Please refer to FIG. 5, in which the phase detector 250 may include: a first logic module 251, an average module 253, a second logic module 255 and a storage unit 257.

The first logic module 251 is connected electrically to the first edge detector 230, the storage unit 257 and the average module 253. The average module 253 is connected electrically between the first logic module 251 and the second logic module 255. The second logic module 255 is connected electrically between the average module 253 and the addition unit 270.

The storage unit 257 stores at least one first sampling point Ps1_0[i:0], Ps1_1[i:0] and Ps1_2[i:0] obtained in the previous sampling cycle.

The first logic module 251 obtains at least one first sampling point Ps1_0[i:0], Ps1_1[i:0] and Ps1_2[i:0] obtained in the previous sampling cycle from the storage unit 257, and calculates at least one second offset OFFSETr_0 and OFFSETr_1 corresponding to a first edge type and at least one third offset OFFSETf_0 and OFFSETf_1 corresponding to a second edge type according to the first sampling points Ps1_0[i:0], Ps1_1[i:0] and Ps1_2[i:0] obtained in the previous sampling cycle and the first edge positions E1_0[i:0], E1_1[i:0] and E1_2[i:0] in the current sampling cycle.

The average module 253 calculates an average value of the second offsets OFFSETr_0 and OFFSETr_1 to obtain a fourth offset OFFSET_r, and calculates an average value of the third offsets OFFSETf_0 and OFFSETf_1 to obtain a fifth offset OFFSET_f.

The second logic module 255 adds the first edge positions E1_0[j:0], E1_1[j:0] and E1_2[j:0] to the fourth offset OFFSET_r or the fifth offset OFFSET_f to obtain the first sampling points Ps1_0[i:0], Ps1_1[i:0] and Ps1_2[i:0].

Additionally, the second logic module 255 stores the obtained first sampling points Ps1_0[i:0], Ps1_1[i:0] and Ps1_2[i:0] to the storage unit 257, for use in the next sampling cycle.

In some embodiments, the first edge type is a rising edge, and the second edge type is a falling edge. In other words, the fourth offset OFFSET_r is the offset (DQS_OFFSET) corresponding to the rising edge, and the fifth offset OFFSET_f is the offset (DQS_OFFSET) corresponding to the falling edge.

The first logic module 251 respectively calculates differences between the first sampling points Ps1_0[i:0], Ps1_1[i:0] and Ps1_2[i:0] obtained in the previous sampling cycle and edge positions of rising edges adjacent thereto in the first edge positions E1_0[j:0], E1_1[j:0] and E1_2[j:0] in the current sampling cycle according to the sampling phases p0 to p9, to obtain the second offsets OFFSETr_0 and OFFSETr_1.

The first logic module 251 further respectively calculates differences between the first sampling points Ps1_0[i:0], Ps1_1[i:0] and Ps1_2[i:0] obtained in the previous sampling cycle and edge positions of falling edges adjacent thereto in the first edge positions E1_0[j:0], E1_1[j:0] and E1_2[j:0] in the current sampling cycle according to the sampling phases p0 to p9, to obtain the third offsets OFFSETf_0 and OFFSETf_1.

Afterwards, the average module 253 calculates an average value of the second offsets OFFSETr_0 and OFFSETr_1 and an average value of the third offsets OFFSETf_0 and OFFSETf_1, to obtain the fourth offset OFFSET_r and the fifth offset OFFSET_f.

In some embodiments, a filter 259 may be disposed between the average module 253 and the second logic module 255. The filter 259 may be a low-pass filter.

The filter 259 may filter high-frequency noises in the fourth offset OFFSET_r and the fifth offset OFFSET_f and maintain stable parts in the fourth offset OFFSET_r and the fifth offset OFFSET_f, thereby providing a filtering capability for noises of the data strobe signal DQS.

In some embodiments, the following Formula 3 may be obtained from Formula 1.

First offset=second sampling point−first sampling point      Formula 3

Figure 6:
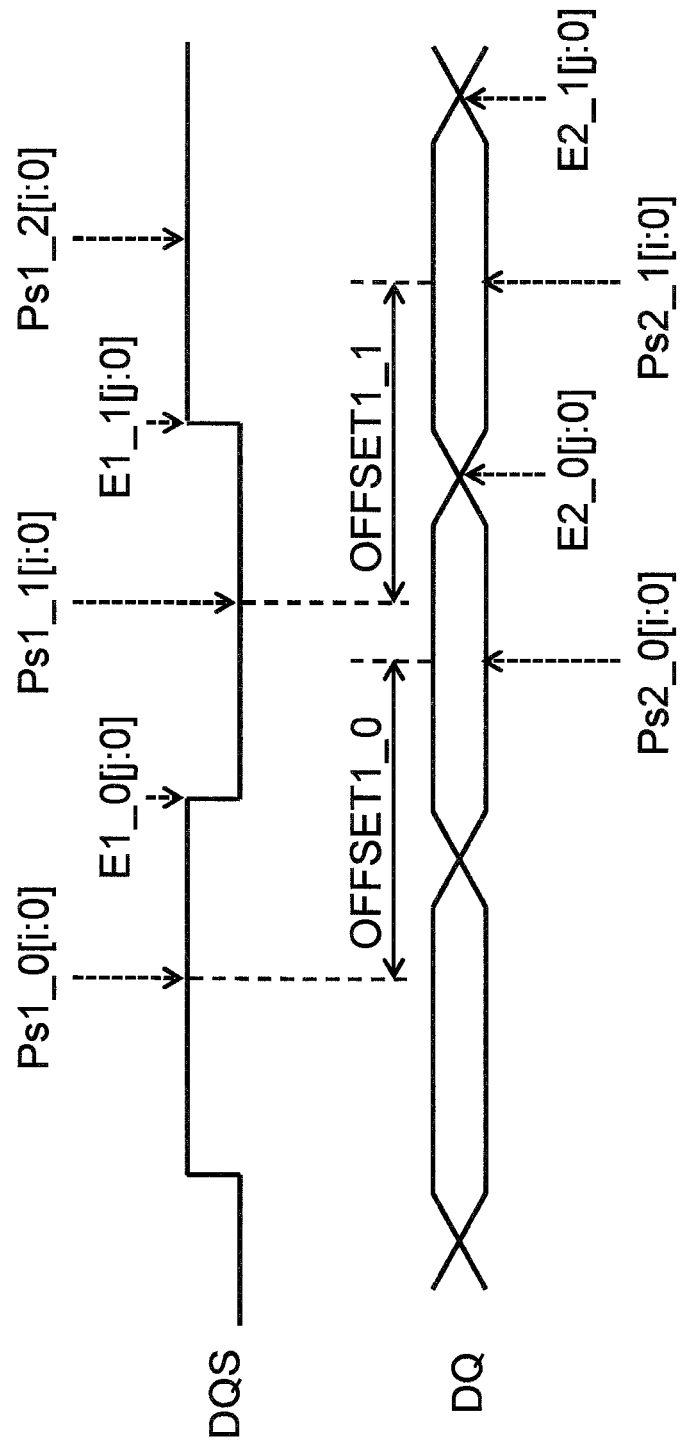
FIG. 6 is a schematic diagram of an embodiment of a corresponding relationship between the data strobe signal and a data signal in the oversampling apparatus of FIG. 2.

Please refer to FIG. 6, in which the first sampling point Ps1_0[i:0] and the first sampling point Ps1_1[i:0] are two adjacent sampling positions of the data strobe signal DQS, and an edge (i.e., the first edge position E1_0[j:0]), definitely exists between the two first sampling points. After the first sampling point Ps1_0[i:0] is added to the first offset OFFSET1_0 and the first sampling point Ps1_1[i:0] is added to the first offset OFFSET1_1, a second sampling point Ps2_0[i:0] corresponding to the first sampling point Ps1_0[i:0] and a second sampling point Ps2_1[i:0] corresponding to the first sampling point Ps1_1[i:0] can be obtained respectively. If the second sampling point Ps2_0[i:0] and the second sampling point Ps2_1[i:0] are actual sampling positions of the data signal DQ, when an edge (i.e., the second edge position E2_0[j:0]) exists between the second sampling point Ps2_0[i:0] and the second sampling point Ps2_1[i:0], the edge of the data signal DQ may correspond to the edge of the data strobe signal DQS, that is, the first edge position E1_0[j:0] corresponds to the second edge position E2_0[j:0].

In other words, the offset (i.e., the first offset OFFSET1[k:0]) between corresponding sampling positions of the data strobe signal DQS and the data signal DQ corresponds to the offset between corresponding edges of the data strobe signal DQS and the data signal DQ.

Consequently, the subtraction unit 260 may respectively calculate differences between the corresponding second edge positions E2_0[j:0], E2_1[j:0] and E2_2[j:0] and the corresponding first edge positions E1_0[j:0], E1_1[j:0] and E1_2[j:0] according to the sampling phases p0 to p9, to obtain the first offset OFFSET1[k:0].

In some embodiments, as the data signal DQ and the data strobe signal DQS may have different DCDs, the offsets (DQS_OFFSET) corresponding to the rising edge and the falling edge may be different. Please refer to FIG. 7, in which the edge offset OFFSETe_r indicates the difference between the rising edge of the data strobe signal DQS to the corresponding edge of the data signal DQ, and the edge offset OFFSETe_f indicates the difference between the falling edge of the data strobe signal DQS to the corresponding edge of the data signal DQ.

Figure 7:
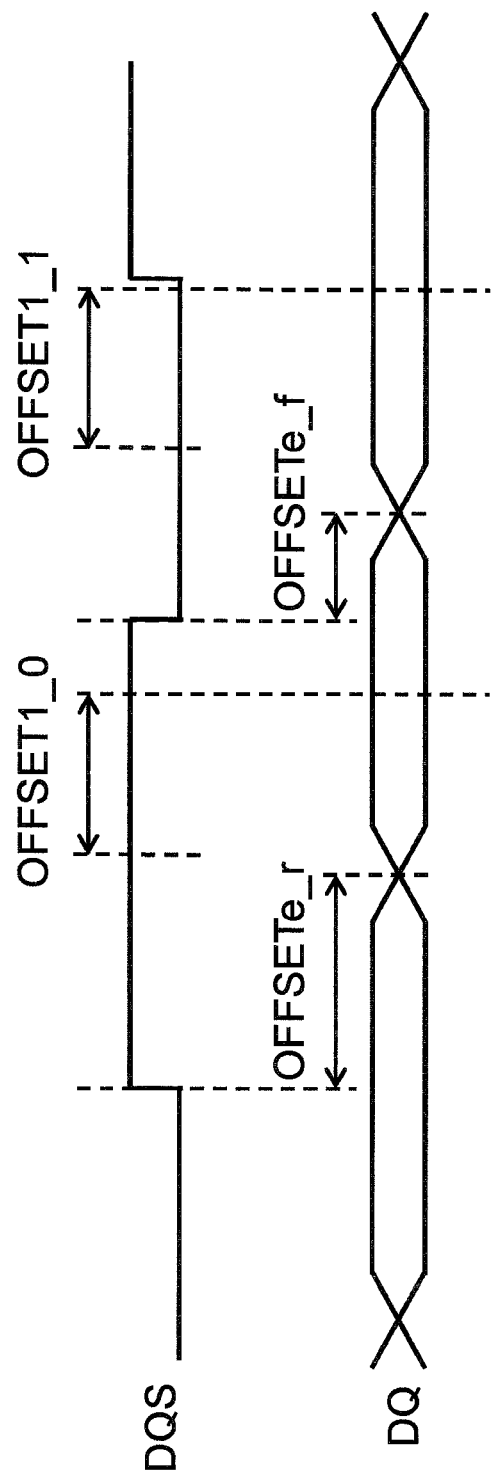
FIG. 7 is a schematic diagram of another embodiment of the corresponding relationship between the data strobe signal and the data signal in the oversampling apparatus of FIG. 2.

Assuming that the cycles of the data strobe signal DQS and the data signal DQ are approximately the same, the following Formula 4 can be obtained from the signal relationship in FIG. 7.

OFFSET1_0=OFFSET1_1=0.5×(OFFSETe_r+ OFFSETe_f)      Formula 4

Thus, the difference (i.e., the first offset OFFSET1[k:0]), between the optimal sampling positions of the data strobe signal DQS and the data signal DQ can be calculated through the difference (i.e., the edge offset OFFSETe_r and the edge offset OFFSETe_f), between the edge of the data strobe signal DQS and the corresponding edge of the data signal DQ according to Formula 4.

Figure 8:
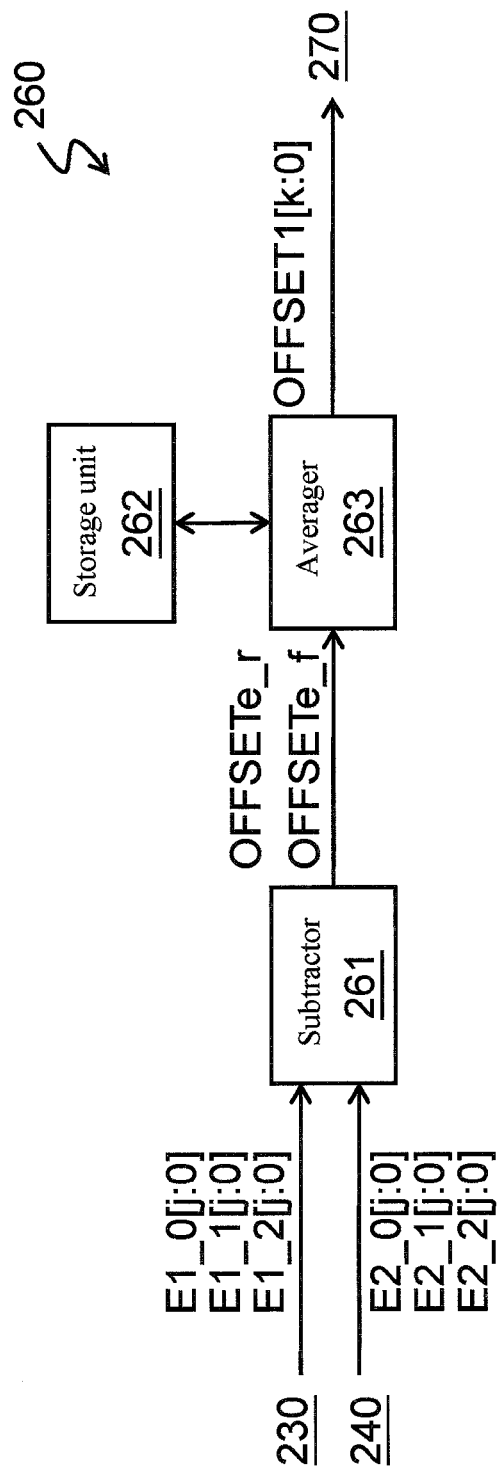
FIG. 8 is a schematic diagram of an embodiment of a subtraction unit in the oversampling apparatus of FIG. 2.

In this embodiment, please refer to FIG. 8, in which the subtraction unit 260 may include a subtractor 261 and an averager 263. An input end of the subtractor 261 is connected electrically with the first edge detector 230 and the second edge detector 240, and an output end of the subtractor 261 is connected electrically with the averager 263. The averager 263 is connected electrically between the subtractor 261 and the addition unit 270 (or the filter 290).

In some embodiments, the subtraction unit 260 may store the first offset OFFSET1[k:0] obtained each time into the storage unit 262. When the second edge detector 240 obtain the second edge positions E2_0[j:0], E2_1[j:0] and E2_2[j:0], the subtractor 261 makes a subtraction between the corresponding first edge positions E1_0[j:0], E1_1[j:0] and E1_2[j:0] and the corresponding second edge positions E2_0[j:0], E2_1[j:0] and E2_2[j:0], to sequentially obtain a plurality of edge offsets OFFSETe_r and OFFSETe_f.

The averager 263 calculates an average value of adjacent edge offsets OFFSETe_r and OFFSETe_f, to obtain the first offset OFFSET1[k:0].

When the second edge detector 240 does not obtain the second edge positions E2_0[j:0], E2_1[j:0] and E2_2[j:0], the averager 263 may provide the first offset OFFSET1[k:0] previously stored in the storage unit 262 for the addition unit 270.

For instance, by taking that the first edge position E1_0[j:0] is a rising edge as an example, the subtractor 261 makes a subtraction between the first edge position E1_0[j:0] and the second edge position E2_0[j:0] to obtain the edge offset OFFSETe_r corresponding to the rising edge, and then makes a subtraction between the first edge position E1_1[j:0] and the second edge position E2_1[j:0] to obtain the edge offset OFFSETe_f corresponding to the falling edge. At this time, the averager 263 continues to calculate an average value between the edge offset OFFSETe_r corresponding to the rising edge and the edge offset OFFSETe_f corresponding to the falling edge to obtain the first offset OFFSET1_0.

In some embodiments, in the $(m+1)^{th}$ sampling cycle, the first second sampling point Ps2_0[i:0] may correspond to a second sampling result in the $m^{th}$ sampling cycle, or the last second sampling point Ps2_2[i:0] may correspond to a second sampling result in the $(m+2)^{th}$ sampling cycle. Thus, the oversampling apparatus 20 may further include a storage unit (not shown). The storage unit may store the second sampling result obtained in the previous sampling cycle, for selecting a corresponding second sampling result in the current sampling cycle according to the second sampling point Ps2_0[i:0] as the output sampling signal Data. The last second sampling point Ps2_2[i:0] in the current sampling cycle may also be stored in the storage unit, for extracting a corresponding second sampling result in the next sampling cycle as the output sampling signal Data. In the implementation, the storage unit may be a storage component identical with the storage unit 257, or may be a different storage component.

In sum, the oversampling method for data signal and the oversampling apparatus thereof according to the present invention are applied to a memory module, to obtain oversampled data of a data signal. In the oversampling method for data signal and the oversampling apparatus thereof according to the present invention, data is extracted by oversampling a data signal and a data strobe signal simultaneously, which avoids using a delay chain and can automatically track a phase difference change between the data signal and the data strobe signal, so as to improve stability of a controller of the memory module on data reading, thereby meeting the demand of increasingly raising the operating frequency of the memory module.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An oversampling method for data signal, comprising;
    oversampling a data strobe signal according to a plurality of sampling phases to generate a plurality of first sampling results;
    oversampling a data signal according to the plurality of sampling phases to generate a plurality of second sampling results;
    performing edge detection on the first sampling results, to obtain at least one first edge position where edges are detected among the first sampling results;
    performing edge detection on the second sampling results, to find out second edge position where edges are detected among the second sampling results;
    when the second edge position is obtained, calculating at least one first offset according to the first edge position and the second edge position, which correspond to the same sampling phase, in at least one first edge position and at least one second edge position;
    when the second edge position is not obtained, using at least one first offset obtained in a previous sampling cycle as the at least one first offset in current sampling cycle;
    calculating at least one first sampling point according to the at least one first edge position;
    calculating at least one second sampling point according to the at least one first sampling point and the respectively corresponding first offset; and
    selecting and outputting at least one of the second sampling results according to the at least one second sampling point.

2. The oversampling method for data signal according to claim 1, further comprising:
    filtering each the first offset before the step of calculating the at least one second sampling point.

3. The oversampling method for data signal according to claim 1, wherein the step of calculating each the first sampling point comprises:
    calculating an intermediate value of each two adjacent first edge positions of the at least one first edge position to obtain the first sampling point.

4. The oversampling method for data signal according to claim 1, wherein the step of calculating each the first sampling point comprises:
    calculating the at least one second offset corresponding to a first edge type and at least one third offset corresponding to a second edge type according to the at least one first sampling point obtained in the previous sampling cycle and the at least one first edge position obtained in the current sampling cycle;
    calculating an average value of the at least one second offset to obtain a fourth offset;
    calculating an average value of the at least one third offset to obtain a fifth offset; and
    obtaining at least one first sampling point according to the at least one first edge position, the fourth offset and the fifth offset.

5. The oversampling method for data signal according to claim 1, wherein the step of calculating each the first sampling point comprises:
    calculating difference between the at least one first sampling point obtained in the previous sampling cycle and at least one position of at least one rising edge adjacent to the at least one first edge position obtained in a current sampling cycle, respectively, to obtain at least one second offset;

calculating difference between the at least one first sampling point obtained in the previous sampling cycle and at least one position of at least one falling edge adjacent to the at least one first edge position obtained in a current sampling cycle, respectively, to obtain at least one third offset;

calculating an average value of the at least one second offset to obtain a fourth offset;

calculating an average value of the at least one third offset to obtain a fifth offset; and adding the at least one position of the at least one rising edge to the at least one fourth offset respectively and adding the at least one position of the at least one falling edge to the at least one fifth offset respectively, to obtain the at least one first sampling point.

6. The oversampling method for data signal according to claim 1, wherein the step of calculating the at least one first offset comprises:

calculating difference between each the first edge position and the corresponding second edge position, to obtain the corresponding first offset.

7. The oversampling method for data signal according to claim 1, wherein the step of calculating the at least one first offset comprises:

calculating difference between each the first edge position and the corresponding second edge positions, to sequentially obtain a plurality of edge offsets; and calculating average value of each two adjacent edge offsets among the edge offsets, to sequentially obtain the at least one first offset.

8. The oversampling method for data signal according to claim 1, further comprising:

storing the at least one first sampling point.

9. The oversampling method for data signal according to claim 1, wherein the step of calculating each the second sampling point comprises:

adding the first sampling point to the corresponding first offset to obtain the second sampling point.

10. An oversampling apparatus, comprising:

a clock generator, for generating a multiphase clock;

an oversampling circuit, for oversampling a data strobe signal and a data signal according to the multiphase clock to respectively generate a plurality of first sampling results and a plurality of second sampling results;

a first edge detector, for performing edge detection on the first sampling results, to obtain at least one first edge position where edges are detected among the first sampling results;

a second edge detector, for performing edge detection on the second sampling results, to find out second edge position where edges are detected among the second sampling results;

a phase detector, for calculating at least one first sampling point according to the at least one first edge position;

a subtraction unit, for calculating at least one first offset according to the at least one first edge position and the second edge position;

an addition unit, for calculating a second sampling point according to each the first sampling point and the corresponding first offset; and an output unit, for selecting and outputting at least one of the second sampling results according to each the second sampling point.

11. The oversampling apparatus according to claim 10, wherein the phase detector obtains the first sampling point by calculating an intermediate value of each two adjacent first edge positions among the at least one first edge position.

12. The oversampling apparatus according to claim 10, wherein the phase detector comprises:

a first logic module, for calculating at least one second offset corresponding to a first edge type and at least one third offset corresponding to a second edge type according to the at least one first sampling point obtained in a previous sampling cycle and the at least one first edge position;

an average module, for calculating an average value of the at least one second offset to obtain a fourth offset, and calculating an average value of the at least one third offset to obtain a fifth offset; and a second logic module, for adding each the first edge position to one of the fourth offset and the fifth offset to obtain the at least one first sampling point.

13. The oversampling apparatus according to claim 12, wherein the phase detector further comprises:

a filter coupled between the average module and the second logic module.

14. The oversampling apparatus according to claim 12, further comprising:

a storage unit, for storing the at least one first sampling point obtained in the previous sampling cycle.

15. The oversampling apparatus according to claim 12, wherein the first edge type is a rising edge, and the second edge type is a falling edge.

16. The oversampling apparatus according to claim 10, further comprising:

a filter coupled between the subtraction unit and the addition unit.

17. The oversampling apparatus according to claim 10, wherein the subtraction unit comprises:

a subtractor, for calculating difference between each the first edge positions and the corresponding second edge position to sequentially obtain a plurality of edge offsets; and an averager, for calculating an average value of each two adjacent edge offsets among the edge offsets to sequentially obtain the at least one first offset.

18. The oversampling apparatus according to claim 17, wherein the subtraction unit further comprises:

a storage unit, for storing the at least one first offset.

19. The oversampling apparatus according to claim 10, wherein the addition unit uses at least one first offset obtained in a previous sampling cycle as the at least one first offset in current sampling cycle for calculation when the second edge detector does not obtain the at least one second edge position.

* * * * *